United States Patent
Yao et al.

(10) Patent No.: US 7,211,518 B2
(45) Date of Patent: May 1, 2007

(54) WAFERLESS AUTOMATIC CLEANING AFTER BARRIER REMOVAL

(75) Inventors: Xiaoqiang Sean Yao, San Jose, CA (US); Bi-Ming Yen, Fremont, CA (US); Taejoon Han, Pleasanton, CA (US); Peter Loewenhardt, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 177 days.

(21) Appl. No.: 10/828,065

(22) Filed: Apr. 19, 2004

(65) Prior Publication Data
US 2005/0233590 A1 Oct. 20, 2005

(51) Int. Cl.
*H01L 21/465* (2006.01)
(52) U.S. Cl. .................. 438/716; 438/905; 134/1.2
(58) Field of Classification Search ............... 438/716, 438/905; 216/74
See application file for complete search history.

(56) References Cited

U.S. PATENT DOCUMENTS

| 6,060,397 | A | * | 5/2000 | Seamons et al. ............ 438/694 |
| 2002/0052114 | A1 | * | 5/2002 | Marks ........................ 438/689 |
| 2003/0032278 | A1 | * | 2/2003 | Chen et al. ................. 438/627 |
| 2005/0079706 | A1 | * | 4/2005 | Kumar et al. ............... 438/638 |

* cited by examiner

*Primary Examiner*—Stephen W. Smoot
(74) *Attorney, Agent, or Firm*—Beyer Weaver LLP

(57) ABSTRACT

A method for forming features in dielectric layers and opening barrier layers for a plurality of wafers and cleaning an etch chamber after processing and removing each wafer of the plurality of wafers is provided. A wafer of the plurality of wafers is placed into the etch chamber wherein the wafer has a barrier layer over the wafer and a dielectric layer over the barrier layer. The dielectric layer is etched. The barrier layer is opened. The wafer is removed from the etch chamber. A waferless automatic cleaning of the etch chamber without the wafer is provided. The waferless automatic cleaning comprises providing a waferless automatic cleaning gas comprising oxygen and nitrogen to the etch chamber and forming a waferless automatic cleaning plasma from the waferless automatic cleaning gas to clean the etch chamber.

12 Claims, 5 Drawing Sheets

WAFERLESS AUTOMATIC CLEANING AFTER BARRIER REMOVAL

BACKGROUND OF THE INVENTION

1. Field of the Invention

The invention relates to semiconductor devices. Relates to the cleaning of etch chambers after a wafer has been removed to improve etch performance.

2. Description of the Related Art

In the formation of semiconductor devices, a barrier layer is etched. Such barrier layers may be silicon nitride SiN. The low power etching of the barrier layer may cause deposition on the etch chamber. It would be desirable to provide a process that cleans the deposition from the etch chamber.

SUMMARY OF THE INVENTION

To achieve the foregoing and in accordance with the purpose of the present invention, a method for forming features in dielectric layers and opening barrier layers for a plurality of wafers and cleaning an etch chamber after processing and removing each wafer of the plurality of wafers is provided. A wafer of the plurality of wafers is placed into the etch chamber wherein the wafer has a barrier layer over a conductive layer over the wafer and a dielectric layer over the barrier layer. The dielectric layer is etched. The barrier layer is opened. The wafer is removed from the etch chamber. A waterless automatic cleaning of the etch chamber without the wafer is provided. The waferless automatic cleaning comprises providing a waferless automatic cleaning gas comprising oxygen and nitrogen to the etch chamber and forming a waferless automatic cleaning plasma from the waferless automatic cleaning gas to clean the etch chamber.

In another manifestation of the invention a method for cleaning an etch chamber after a barrier layer opening has been performed and a wafer has been removed from the etch chamber to empty the etch chamber is provided. A waferless automatic cleaning gas comprising oxygen and nitrogen is provided to the etch chamber. A waferless automatic cleaning plasma is formed from the waterless automatic cleaning gas to clean the etch chamber.

In another manifestation of the invention, an apparatus for etching a feature in a dielectric layer and opening barrier layers for a plurality of wafers is provided. An etch chamber is provided. An upper electrode is provided within the etch chamber. A lower electrode is provided within the etch chamber. An RF source is electrically connected to at least one of the upper electrode and lower electrode. A gas source is in fluid connection with the etch chamber to provide gas into the etch chamber. A controller is controllably connected to the RF source and the gas source. The controller comprises computer readable code for etching the dielectric layer, computer readable code for opening the barrier layer, and computer readable code for providing a waferless automatic cleaning of the etch chamber after a wafer has been removed from the etch chamber to empty the etch chamber after the opening of a barrier layer. The computer readable media for providing waferless automatic cleaning comprises computer readable code for providing a waferless automatic cleaning gas comprising oxygen and nitrogen to the etch chamber and computer readable code for forming a waferless automatic cleaning plasma from the waferless automatic cleaning gas to clean the etch chamber.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
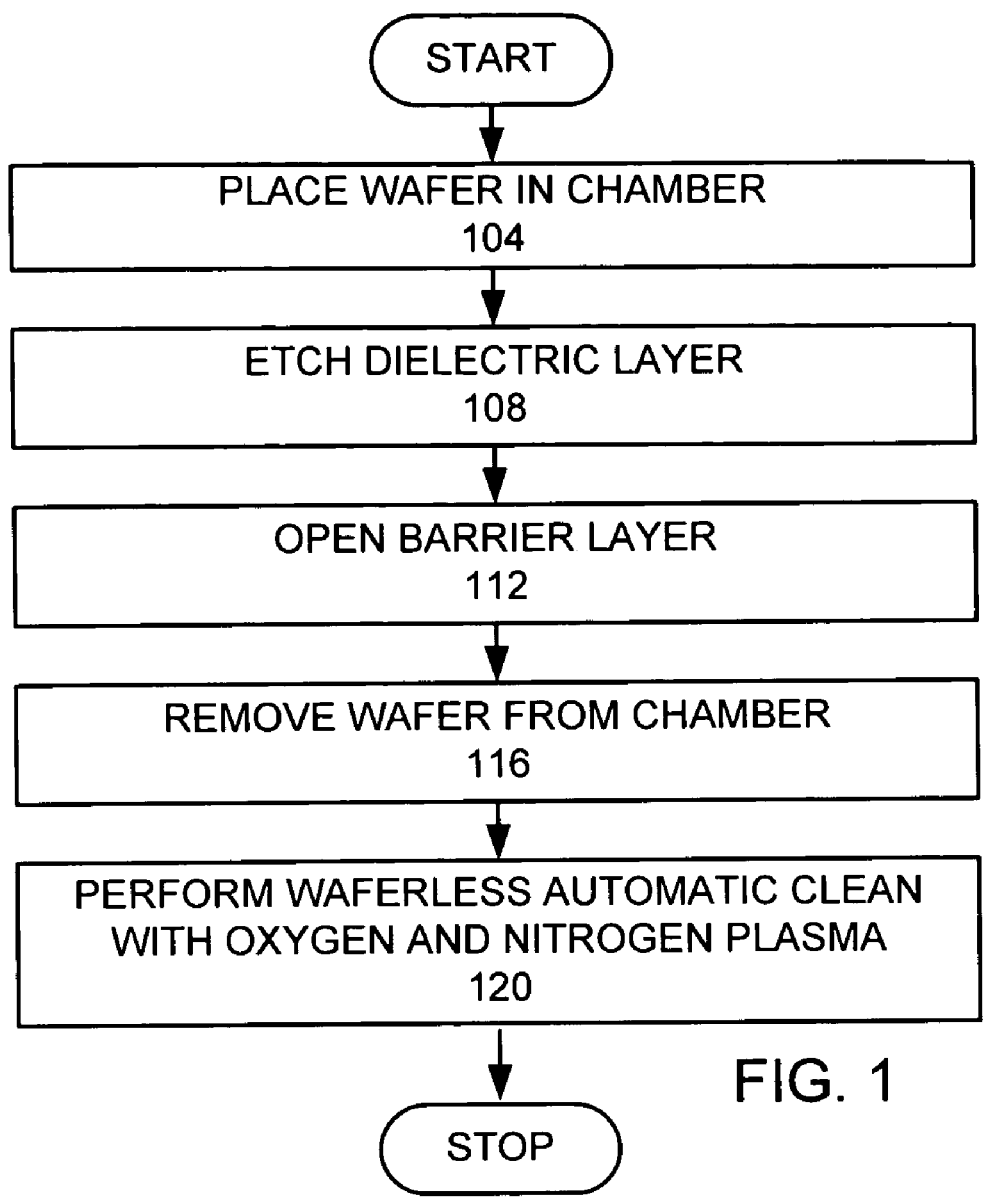
FIG. 1 is a high level flow chart for part of a process for forming a feature in a dielectric layer that uses the invention.

To facilitate understanding, FIG. 1 is a high level flow chart for part of a process for forming a feature in a dielectric layer that uses the invention. A wafer is placed in an etch chamber (step 104). A dielectric etch is performed on the wafer (step 108). After the dielectric etch the barrier layer is opened (step 112). The wafer is then removed from the etch chamber (step 116). The empty etch chamber is then subjected to a waterless automatic clean using a plasma of oxygen and nitrogen.

EXAMPLE

Figure 2A:
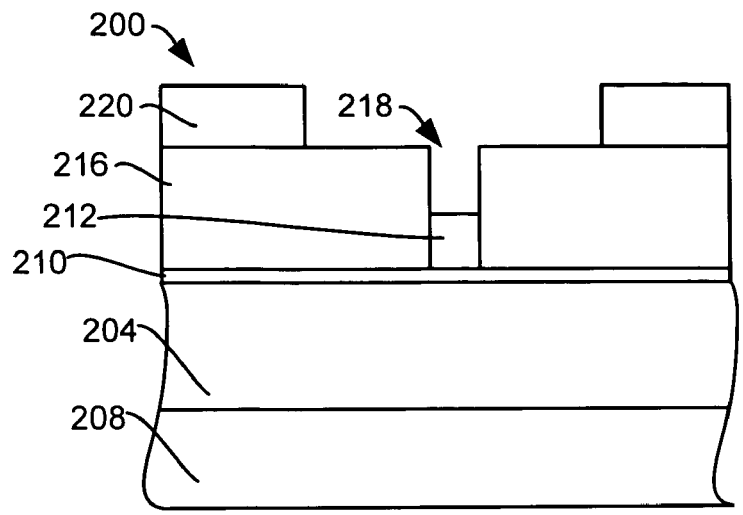
FIGS. 2A–C are a schematic cross-sectional views of part of a wafer that may be used in the inventive process.

In an example of the invention, a wafer is placed in an etch chamber (step 104). FIG. 2A is a schematic cross-sectional view of part of a wafer 200 that may be used in the inventive process. The wafer 200 in this example comprises at least one conductive contact 204 over a substrate 208. A barrier layer 210 is placed over the conductive contact 204. If the conductive contact 204 in this example is copper. In this example the barrier layer is silicon nitride (SiN). In other embodiments, the barrier layer may be silicon carbide (SiC). The barrier layer may have dopants. A dielectric etch layer 216 is placed over the barrier layer 210. In this example, the dielectric etch layer is a silicon oxide based dielectric layer or a low-k (k<4.0) dielectric material. A photoresist mask 220 is placed over the dielectric etch layer 216. In this example, a dual damascene feature is being formed using a via first process. In such a process, a via 218 has been etched into the dielectric etch layer 216. A photoresist mask for the via etch has been removed and a photoresist mask 220 for a trench pattern has been formed.

In addition, in this example, a via plug 212 has been formed in the via 218. Although the discussed layers are shown to be on top of each other (i.e. the photoresist mask is directly on top of the dielectric etch layer), one or more layers may be placed between such layers, (i.e. an anti-reflective layer may be between the photoresist mask and the dielectric etch layer). This is why in the specification and claims various layers are described as being "over" other layers. Possible intermediate layers are not shown for the sake of clarity.

Figure 3:
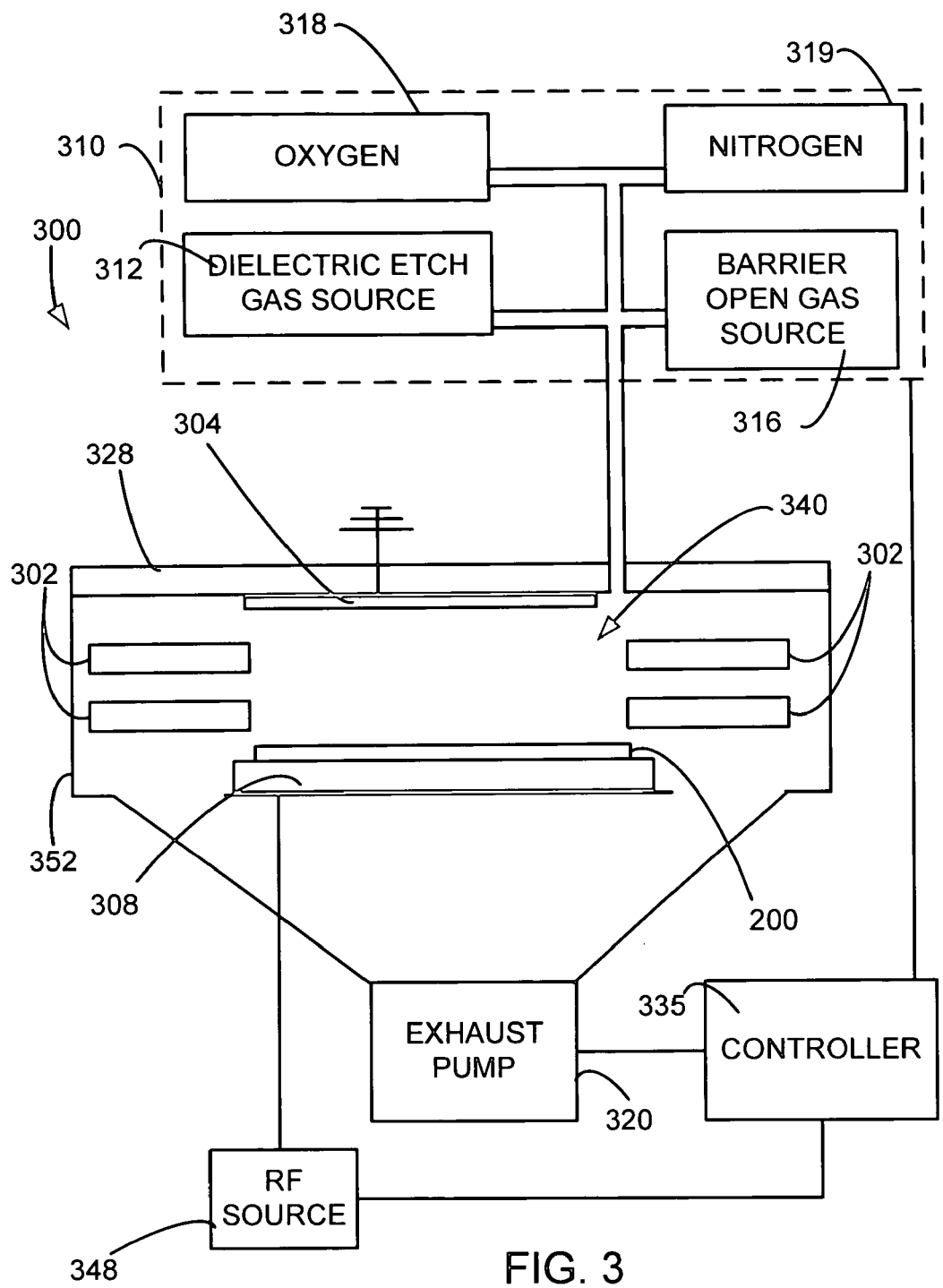
FIG. 3 is a schematic view of an etch chamber that may be used in a preferred embodiment of the invention.

FIG. 3 is a schematic view of an etch chamber 300 that may be used for opening the barrier layer. The etch chamber 300 comprises confinement rings 302, an upper electrode 304, a lower electrode 308, a gas source 310, and an exhaust pump 320. The gas source 310 comprises a dielectric etch gas source 312, a barrier open gas source 316, an oxygen gas source 318, and a nitrogen gas source 319. Various gases may be used for multiple processes. In such a case, the different gas sources may be combined. For example, nitrogen may be used during the barrier open. In such a case, only a single nitrogen source may be provided. The various gas sources are shown to schematically illustrate the workings of the invention. The gas source 310 may comprise additional gas sources. Within plasma processing chamber 300, the substrate 200 is positioned upon the lower electrode 308. The lower electrode 308 incorporates a suitable substrate chucking mechanism (e.g., electrostatic, mechanical clamping, or the like) for holding the substrate 200. The reactor top 328 incorporates the upper electrode 304 disposed immediately opposite the lower electrode 308. The upper electrode 304, lower electrode 308, and confinement rings 302 define the confined plasma volume. Gas is supplied to the confined plasma volume by the gas source 310 and is exhausted from the confined plasma volume through the confinement rings 302 and an exhaust port by the exhaust pump 320. An RF source 348 is electrically connected to the lower electrode 308. The upper electrode 304 is grounded. Chamber walls 352 surround the confinement rings 302, the upper electrode 304, and the lower electrode 308. The RF source 348 may comprise a 27 MHz power source and a 2 MHz power source. An Exelan DFC™ dielectric etcher, which is made by LAM Research Corporation™ of Fremont, Calif., was used in this example of the invention. Different combinations of connecting RF power to the electrode are possible in other embodiments, such as having an RF source connected to the upper electrode 304.

Figure 4A:
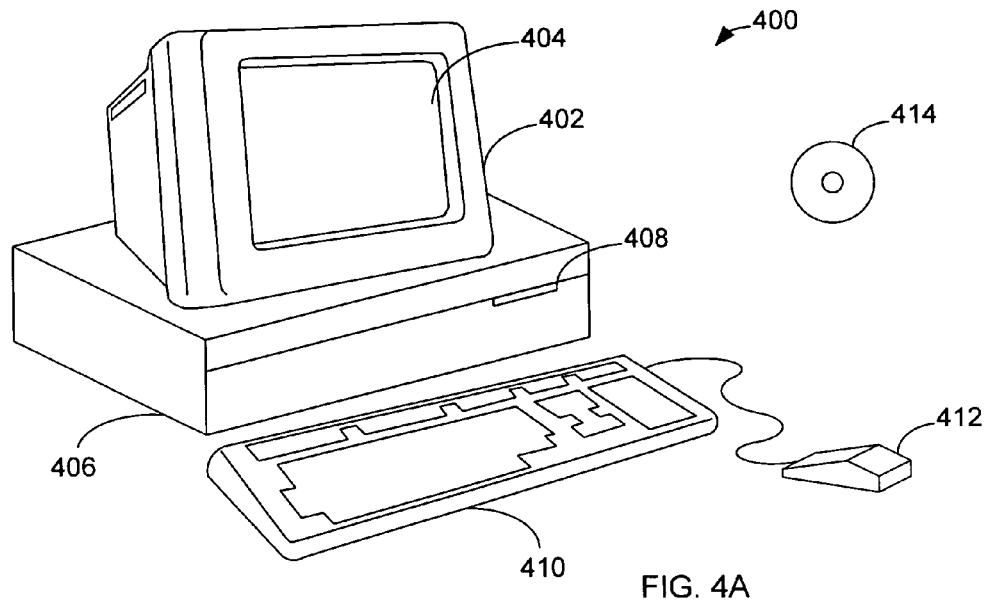
FIGS. 4A and 4B illustrate a computer system, which is suitable for implementing a controller.
Figure 4B:
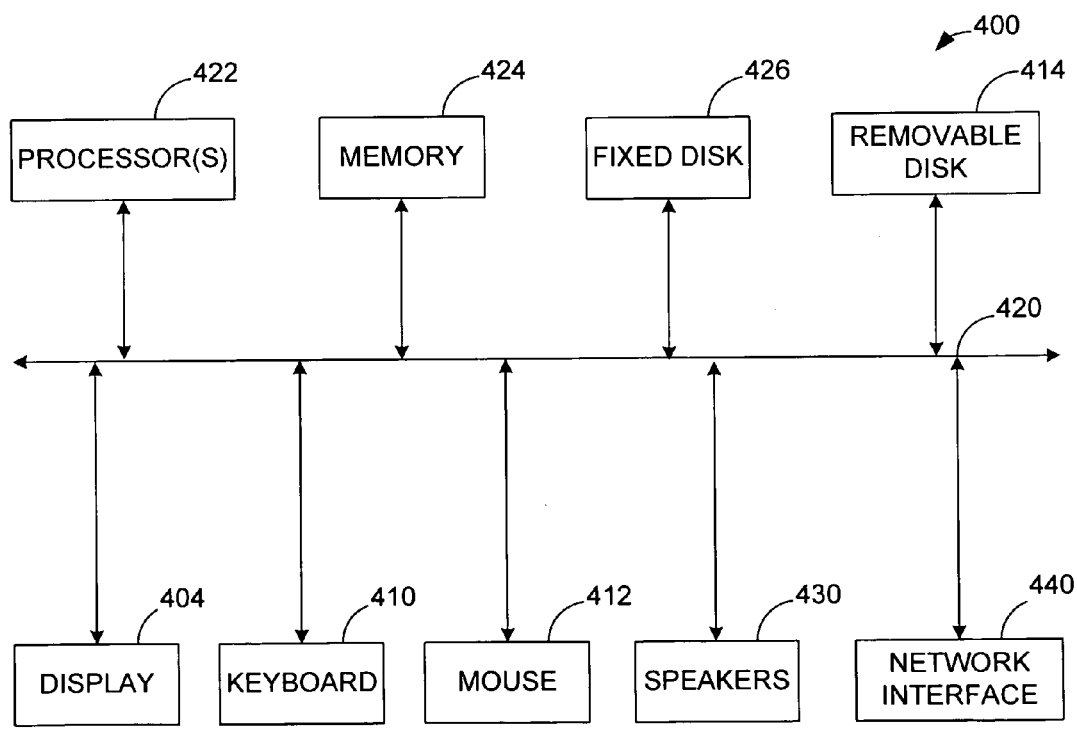

FIGS. 4A and 4B illustrate a computer system 400, which is suitable for implementing a controller 335 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

FIG. 4B is an example of a block diagram for computer system 400. Attached to system bus 420 is a wide variety of subsystems. Processor(s) 422 (also referred to as central processing units or CPUs) are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk) that is slower than primary storage. It will be appreciated that the information retained within fixed disk 426 may, in appropriate cases, be incorporated in standard fashion as virtual memory in memory 424. Removable disk 414 may take the form of any of the computer-readable media described below.

CPU 422 is also coupled to a variety of input/output devices, such as display 404, keyboard 410, mouse 412 and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
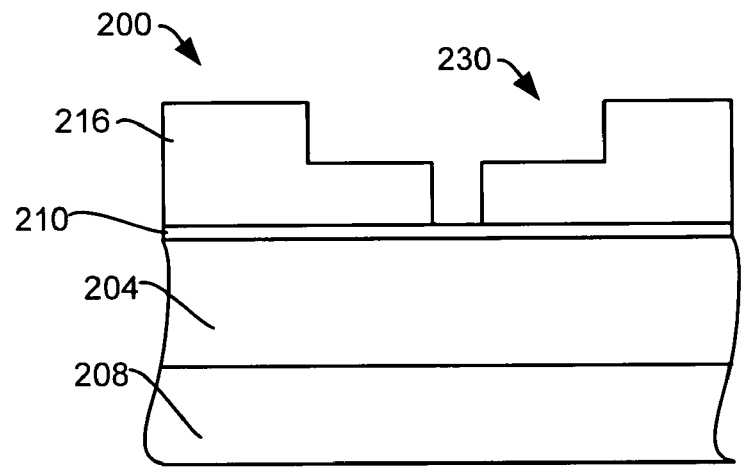

In this example, the dielectric etch layer 220 is a silicon oxide based dielectric. A trench etch is used to etch the dielectric etch layer (step 108) to form the trench 230, as shown in FIG. 2B. The photoresist mask 220 and plug 212 may be stripped away during or after the trench etch.

Figure 2C:
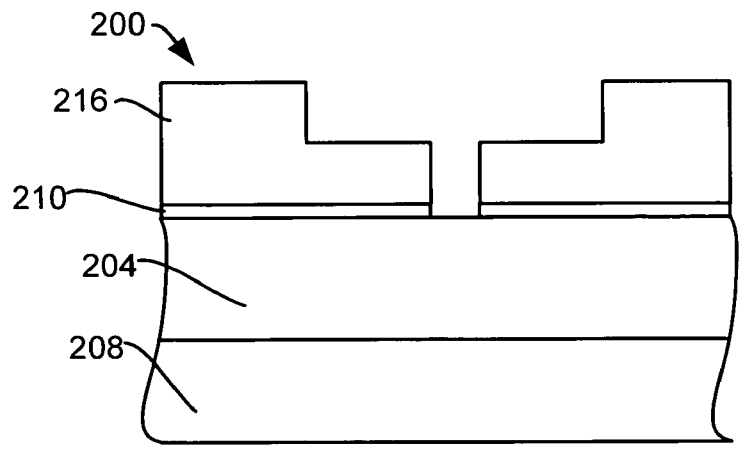

The barier layer is then opened (step 112), as shown in FIG. 2C. An example of an etch recipe for opening a SiN barrier layer is as follows:

First, the lower electrode is cooled to 30° C. A stabilization step is provided. In this stabilization step, the chamber pressure is set to 150 mTorr. No power is provided by the RF source 348. A barrier open stabilization gas flow of 200 sccm $N_2$, 50 sccm $CF_4$, and 10 sccm $CHF_3$ is provided for 15 seconds.

Next, a plasma strike step is provided. The chamber pressure is maintained at 150 mTorr. 100 watts at 27 MHz and 100 watts at 2 MHz are provided by the RF source 348.

A strike gas flow of 200 sccm $N_2$, 50 sccm $CF_4$, and 10 sccm $CHF_3$ is provided for 5 seconds.

Next, a main etch step is provided. The chamber pressure is maintained at 150 mTorr. 200 watts at 27 MHz and 400 watts at 2 MHz are provided by the RF source 348. The lower electrode is cooled to 30° C. A main etch gas flow of 200 sccm $N_2$, 50 sccm $CF_4$, 10 sccm $CHF_3$, and 5 sccm $O_2$ is provided for 18 seconds.

Finally, an over etch step is provided. The chamber pressure is maintained at 150 mTorr. 200 watts at 27 MHz and 400 watts at 2 MHz are provided by the RF source 348. The lower electrode is cooled to 30° C. An over etch gas flow of 200 sccm $N_2$, 50 sccm $CF_4$, and 10 sccm $CHF_3$ is provided for 17 seconds.

In this example, a post etch treatment is provided after the barrier open, according to the following recipe. First, a stabilization step is provided. In this stabilization step, the chamber pressure is set to 200 mTorr. No power is provided by the RF source 348. The lower electrode is cooled to 30° C. A post etch treatment stabilization gas flow of 800 sccm $H_2$ and 200 sccm Ar is provided for 20 seconds.

Next, a plasma strike step is provided. The chamber pressure is maintained at 200 mTorr. 200 watts at 27 MHz and 300 watts at 2 MHz are provided by the RF source 348. The lower electrode is cooled to 30° C. A strike gas flow of 800 sccm $H_2$ and 200 sccm Ar is provided for 5 seconds.

Finally, a main post etch treatment step is provided. The chamber pressure is maintained at 200 mTorr. 1,000 watts at 27 MHz and 0 watts at 2 MHz are provided by the RF source 348. The lower electrode is cooled to 30° C. A main post etch treatment gas flow of 800 sccm $H_2$ is provided for 15 seconds. The post etch treatment may be used to clean polymer and other deposits from the wafer.

The wafer 200 is removed from the etch chamber 300 (step 116). A waferless automatic clean is then performed on the empty etch chamber 300 (step 120).

Figure 5:
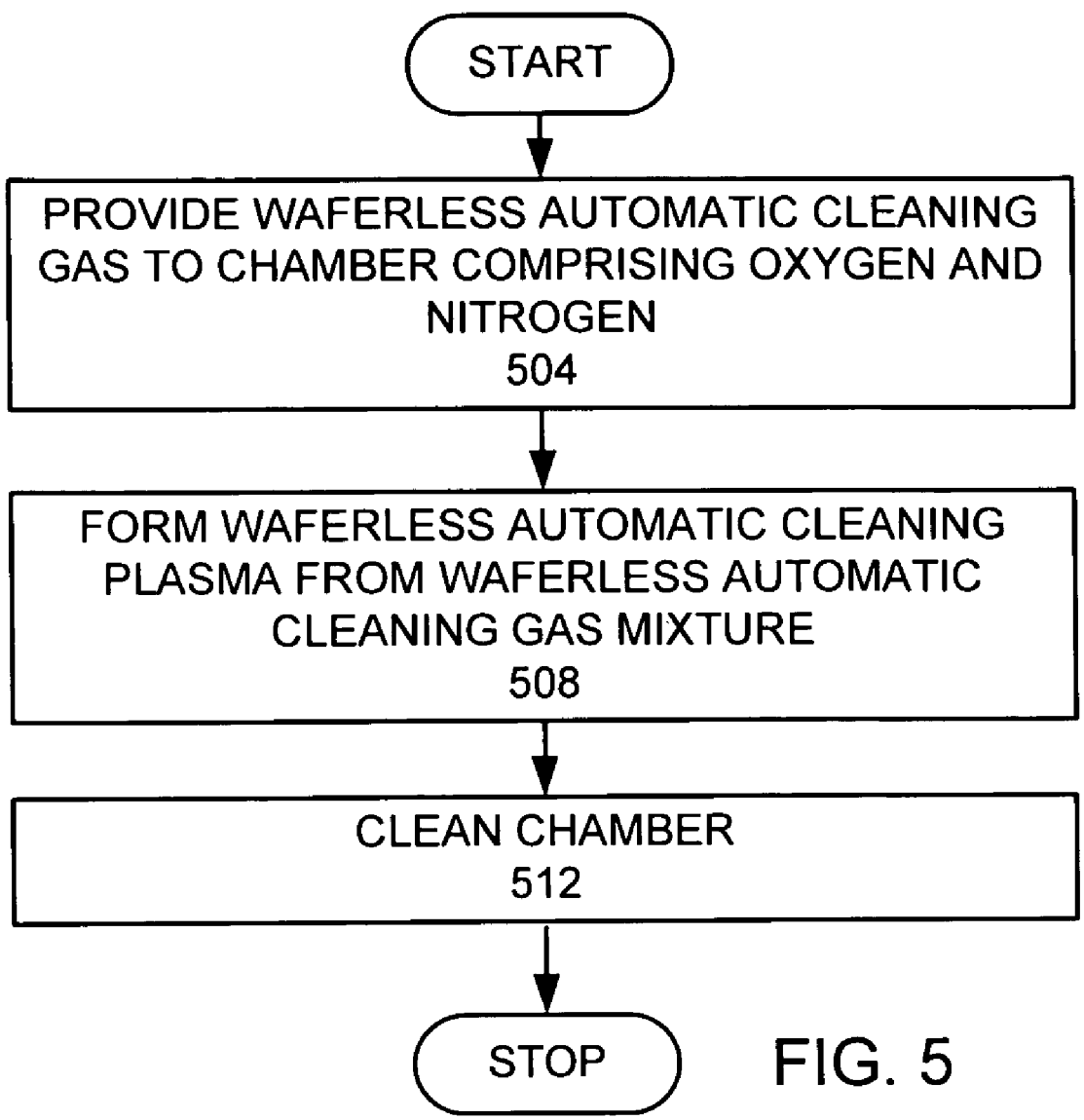
FIG. 5 is a more detailed flow chart of a waferless automatic clean process.

FIG. 5 is a more detailed flow chart of a waferless automatic clean process used in this example. A waferless automatic cleaning gas comprising oxygen and nitrogen is provided into the etch chamber 300 (step 504). In this example, 1,000 sccm of $N_2$ and 10 sccm of $O_2$ is provided. The pressure in the etch chamber in this example is maintained at 680 mTorr. A waferless automatic cleaning plasma is formed from the waferless automatic cleaning gas mixture (step 508). In this example, 500 watts at 27 MHz and 0 watts are 2 MHz are provided by the RF source 348 for 20 seconds. The resulting plasma cleans the chamber (step 512).

The flow ratio of oxygen to nitrogen is preferably between 1:200 to 1:50. More preferably, the flow ratio of oxygen to nitrogen is between 1:99 to 2:98. In the preferred embodiment, the waferless automatic cleaning gas consists essentially of nitrogen and oxygen. In other embodiments, other gases or diluents may be added. Preferably, the RF source provides more than 300 watts at a high frequency between 12–50 MHz and 0–50 watts at a low frequency between 0.1–10 MHz. More preferably, the RF source provides between about 300-1,000 watts at a high frequency between 12–50 MHz and 0–25 watts at a low frequency between 0.1–10 MHz. Most preferably, the RF source provides about 500 watts at a high frequency of about 27 MHz and about 0 watts at any low frequency below 10 MHz. Preferably, during the waferless automatic cleaning the chamber pressure is between 250–1,000 mTorr. More preferably, during the waferless automatic cleaning the chamber pressure is between 400–900 mTorr.

In the preferred embodiment, the waferless automatic cleaning is done after each wafer is removed after a barrier open is performed. Other embodiments may allow less frequent waferless automatic cleaning.

The etch rate and etch uniformity were measured for each wafer for a number wafers being processed, thus having a number of waferless automatic cleanings using the inventive waferless automatic cleaning process with a waferless automatic cleaning gas of nitrogen with 1–2% oxygen. This process was compared to other waferless automatic cleaning processes.

The etch rate and etch uniformity were measured for the first and two hundredth wafer being processed, where oxygen only was used for the waterless automatic cleaning. Using a waferless automatic cleaning with only oxygen as the waferless automatic cleaning gas caused a process shift of 12% between the first and two hundredth wafers. Etch uniformity tests using only oxygen as the waterless automatic cleaning gas shows the uniformity changes, which indicates that either the center or edge etch rates vary during the etching of 200 wafers. In addition, it has been found that waferless automatic cleaning using only oxygen results in a build up of polymer on the upper electrode.

A waferless automatic cleaning was also performed using only nitrogen, without any oxygen. It was found that such a waferless automatic cleaning process did not cause polymer build up on the upper electrode, but did cause polymer build up on the lower electrode.

It has also been found that when no waferless automatic cleaning is provided the lower electrode becomes contaminated, which causes particle contamination.

It was found that using the inventive waferless automatic cleaning that during the etching of 1500 wafers there was an etch process shift of less than 7% with a non-monotonic trend. Etch uniformity using the inventive waferless automatic cleaning was stable. Therefore the invention provides a more consistent wafer to wafer etch rate over a large number of wafers (i.e. greater than 1,500) and improves etch rate uniformity and stability for an individual wafer. It has been found that the inventive waferless automatic cleaning also prevents polymer build up on both the upper and the lower electrode.

Without being limited by theory, it is believed that low power used in the barrier layer open step and the chemistry of SiN provide contaminants within the etch chamber that are difficult to clean. It has been found that using a waferless automatic cleaning gas of only oxygen results in a process shift and polymer build up at the top electrode area. On the other hand, it has been found that using a waterless automatic cleaning gas of only nitrogen results in polymer build up on confinement rings and the lower electrode area. The inventive waferless automatic cleaning process with a mixture of nitrogen and oxygen has been found to prevent process shift and polymer build up at both the top and lower electrode areas.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for forming features in dielectric layers and opening barrier layers for a plurality of wafers and cleaning an etch chamber after processing and removing each wafer of the plurality of wafers, comprising:
    placing a wafer of the plurality of wafers into the etch chamber wherein the wafer has a barrier layer over the wafer and a dielectric layer over the barrier layer;
    etching the dielectric layer;
    opening the barrier layer;
    removing the wafer from the etch chamber; and
    providing a waferless automatic cleaning of the etch chamber without the wafer, comprising:
        providing a waferless automatic cleaning gas consisting essentially of oxygen and nitrogen to the etch chamber, wherein a flow ratio of oxygen to nitrogen of the waferless automatic cleaning gas is between 1:99 to 298; and
        forming a waferless automatic cleaning plasma from the waferless automatic cleaning gas to clean the etch chamber.

2. The method, as recited in claim 1, wherein the barrier layer is selected from the group of SiN and SiC.

3. The method, as recited in claim 2, wherein waferless automatic cleaning is provided each time a wafer of the plurality of wafers is removed from the etch chamber to empty the etch chamber after the barrier layer opening.

4. The method, as recited in claim 3, wherein the etch chamber has an upper electrode and a lower electrode, wherein the waferless automatic cleaning is able to clean both the upper electrode and the lower electrode.

5. The method, as recited in claim 4, wherein the forming the waferless automatic cleaning plasma comprises providing more than 300 watts at a frequency between 12–50 MHz.

6. The method, as recited in claim 5, wherein the forming the waferless automatic cleaning plasma further comprises maintaining a chamber pressure between 500–750 mTorr.

7. The method, as recited in claim 1, wherein the barrier layer is SiN.

8. A method for cleaning an etch chamber after a barrier layer opening has been performed and a wafer has been removed from the etch chamber to empty the etch chamber, wherein the barrier layer is situated between the wafer and a dielectric layer, comprising:
    providing a waferless automatic cleaning gas consisting essentially of comprising oxygen and nitrogen to the etch chamber, wherein a flow ratio of oxygen to nitrogen in the waferless automatic cleaning gas is between 1:99 to 2:98; and
    forming a waferless automatic cleaning plasma from the waferless automatic cleaning gas to clean the etch chamber.

9. The method, as recited in claim 8, wherein the baffler layer opening opens a barrier layer selected from the group of SiN and SiC.

10. The method, as recited in claim 8, wherein the etch chamber has an upper electrode and a lower electrode, wherein the waferless automatic cleaning is able to clean both the upper electrode and the lower electrode.

11. The method, as recited in claim 8, wherein the forming the waferless automatic cleaning plasma comprises providing more than 300 watts at a frequency between 12–50 MHz.

12. The method, as recited in claim 11, wherein the forming the waferless automatic cleaning plasma further comprises maintaining a chamber pressure between 500–750 mTorr.

* * * * *